United States Patent [19]

Uchida et al.

[11] Patent Number: 5,235,609

[45] Date of Patent: Aug. 10, 1993

[54] SEMICONDUCTOR LASER DEVICE

[75] Inventors: Satoshi Uchida; Kaoru Kusunoki; Masato Mushiage, all of Kyoto, Japan

[73] Assignee: Rohm Co., Ltd., Kyoto, Japan

[21] Appl. No.: 778,550

[22] Filed: Oct. 18, 1991

[30] Foreign Application Priority Data

Oct. 19, 1990 [JP] Japan ................. 2-282765

[51] Int. Cl.$^5$ ............................... H01S 3/19
[52] U.S. Cl. ....................................... 372/46
[58] Field of Search ............................ 372/45, 46

[56] References Cited

U.S. PATENT DOCUMENTS 4,359,776 11/1982 Acket et al. .................. 372/46
4,594,718 6/1986 Scifres et al. ................. 372/46

Primary Examiner—James W. Davie
Attorney, Agent, or Firm—Nikaido, Marmelstein, Murray & Oram

[57] ABSTRACT

A semiconductor laser device comprises: an active layer; a lower clad layer provided below the active layer; an upper clad layer provided above the active layer; and a current blocking layer, provided above the upper clad layer, for limiting an active region of the active layer in a direction along a width to make the active region of a striped form which has a wide portion and a narrow portion. According to the device, coherence of an oscillated laser beam is reduced, thereby to decrease a feedback induced noise when used for a pickup of an optical information recording/reproducing apparatus.

10 Claims, 3 Drawing Sheets

31 Striped groove

W prior art

31 Striped groove
10 P electrode
12 Cap layer
Current blocking layer 16
AlGaAs layer 18
14 Second upper clad layer
Protecting layer 20
First upper clad layer 22
Active layer 24
Lower clad layer 26
Substrate 28
N electrode 30

SEMICONDUCTOR LASER DEVICE

BACKGROUND OF THE INVENTION

1. Field of the Invention

The present invention relates to a semiconductor laser device. More particularly, the present invention relates to a semiconductor laser device of a double hetero structure.

2. Description of the Prior Arts

Conventional semiconductor laser devices have been of a structure as shown in FIGS. 1 and 2. In such semiconductor laser devices, an active region, where laser is oscillated, in an active layer 24 is limited not only in a vertical direction by a hetero junction between a first upper clad layer 22 and a lower clad layer 26 in FIG. 1 but also in a horizontal direction by providing a current blocking layer 16. That is, an area of a pumping region is decreased by limiting pumping current to a portion where the current blocking layer 16 is not provided (that is, a striped groove 31) to reduce an amount of current required for pumping. With such structure, since an oscillation region is small, a complicated oscillation hardly occurs. Consequently, uniform laser beam is obtained.

When a semiconductor laser device is used for reading out (picking up) bit information with an optical information recording/reproducing apparatus such as a compact disk player, etc., a part of the laser beam oscillated by the semiconductor laser device is reflected by a pick up optical system (including the disk) and returned to the semiconductor laser device itself. It is known that oscillation of the semiconductor laser device is affected by the optical feed back since the above semiconductor laser device has coherence so that noise is generated in the outputted laser beam. Such noise causes a reading-out error in such optical information recording/reproducing apparatus.

SUMMARY OF THE INVENTION

An object of the present invention is to provide a semiconductor laser device where coherence is reduced.

Another object of the present invention is to provide a semiconductor laser device where noise is hardly generated when used for a pickup of an optical information recording/reproducing apparatus.

According to one feature of the present invention, a semiconductor laser device are provided with: an active layer; a lower clad layer provided below the active layer; an upper clad layer provided above the active layer; and a current blocking layer, provided on the upper clad layer, for limiting an active region of the active layer in a direction along a width of the active region to make the active region of a striped form which has a wide portion and a narrow portion.

BRIEF DESCRIPTION OF THE DRAWINGS

These and other objects and features of this invention will become clear from the following description taken in conjunction with the preferred embodiments with reference to the accompanied drawings in which.

DETAILED DESCRIPTION OF THE PREFERRED EMBODIMENT

Figure 4:
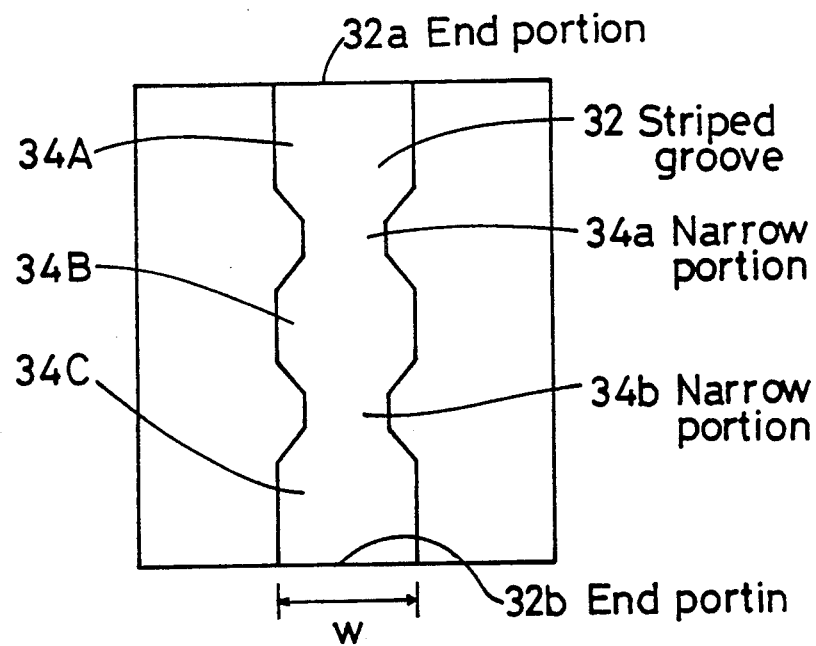
FIG. 4 is a plan view of a semiconductor laser device which is an embodiment of the present invention.
Figure 5:
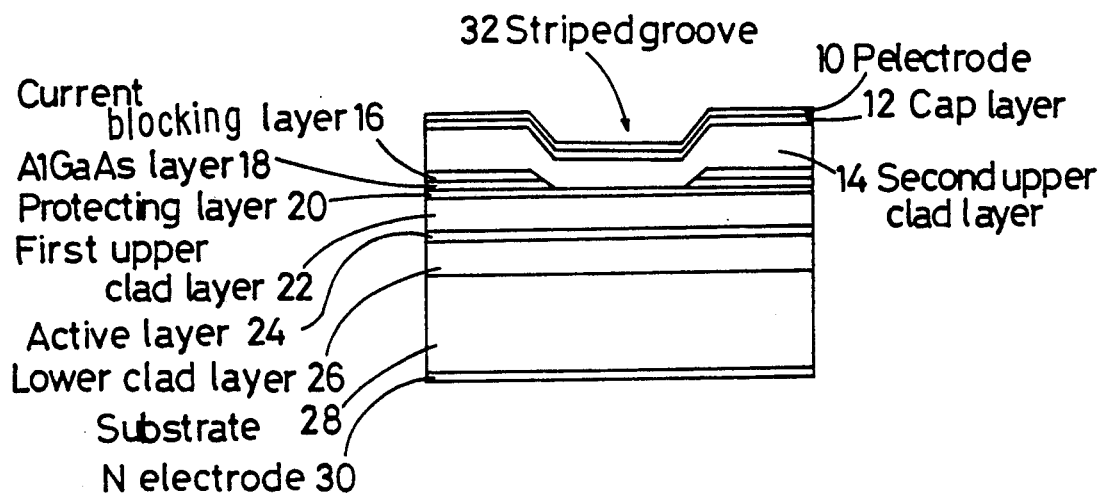
FIG. 5 is a cross-sectional view of the semiconductor laser device which is an embodiment of the present invention.

FIGS. 4 and 5 shows a structure of a semiconductor laser chip which is an embodiment of the present invention. First, a cross-sectional structure shown in FIG. 5 will be described. This chip is made by forming on a substrate 28 consisting of N-type GaAs, a lower clad layer 26 consisting of N-type $Al_xGa_{1-x}As$ (Al composition x=0.55), an active layer 24 consisting of $Al_xGa_{1-x}As$ (Al composition x=0.12), a first upper clad layer 22 consisting of P-type $Al_xGa_{1-x}As$ (Al composition x=0.55), a protecting layer 20 consisting of P-type GaAs and having a band gap equal to or larger than that of the active layer 24 because of a quantum effect, an AlGaAs layer 18 consisting of N-type $Al_xGa_{1-x}As$ (Al composition x=0.55), a current blocking layer 16 consisting of N-type GaAs, a second upper clad layer 14 consisting of P-type $Al_xGa_{1-x}As$ (Al composition x=0.55), and a cap layer 12 consisting of $P^+$-type GaAs. The AlGaAs layer 18 and the current blocking layer 16 are striped-shapedly removed in the center. In the removed portion (a striped groove 32), the second upper clad layer 14 is formed on the protecting layer 20. An N electrode 30 is provided under the substrate 28, and a P electrode is provided over the cap layer 12.

Figure 1:
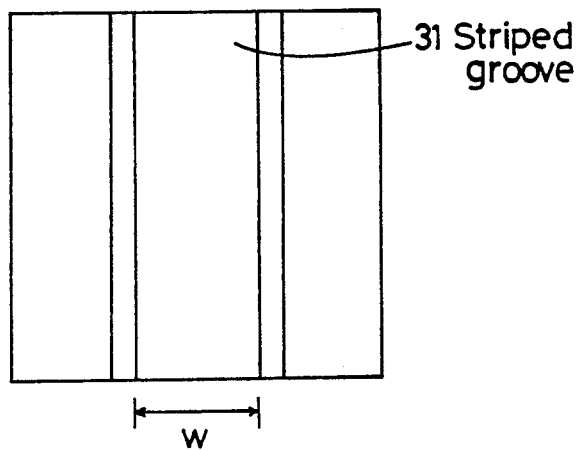
FIG. 1 is a plan view of a conventional semiconductor laser device.
Figure 2:
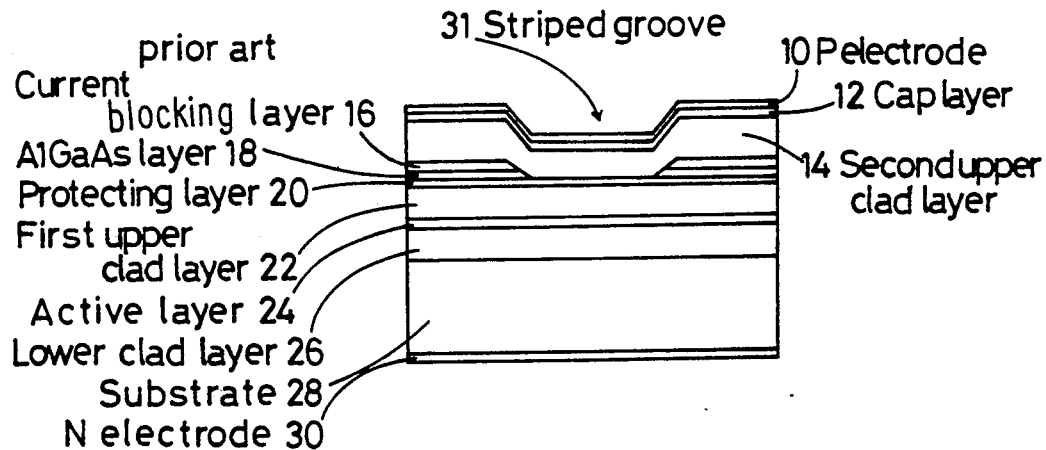
FIG. 2 is a cross-sectional view of the conventional semiconductor laser device.

Although the cross-sectional structure itself is the same as that of the conventional semiconductor laser device shown in FIG. 2, in the semiconductor laser device according to the present invention, as shown in FIG. 4, the striped groove 32 is not of a uniform shape but has a plurality of narrow portions 34a and 34b and a plurality of wide portions 34A, 34B and 34C in a direction along a length. These narrow portions 34a and 34b are provided at portions other than both end portions 32a and 32b in a direction along the length inside the striped groove 32. That is, a width W of the both end portions 32a and 32b of the striped groove 32 is the same as that of conventional semiconductor laser devices.

Next, a manufacturing process of the chip will briefly be described. First, in a first molecular beam epitaxy (MBE) process, the layers from the lower clad layer 26 to the current blocking layer 16 (these layers are referred to as a first growing layer) are formed on the substrate 28. Then, in an etching process, the surface of the first growing layer is dug to form the striped groove 32 until the surface of the protecting layer 20 is disclosed. At this time, the striped groove 32 according to the present invention is formed by giving to an opening of a resist a striped configuration having the narrow and wide portions as shown in FIG. 4 (this configuration will hereinafter be referred to as partly narrow configuration).

The substrate where the striped groove 32 is formed as described above is again put in an MBE apparatus. First, impurities which adhered in the etching process are removed by irradiating an arsenic molecular beam on the surface of the substrate while heating the substrate (a thermal cleaning process). Then, in a second MBE process, the second upper clad layer 14 and the cap layer 12 (these layers will be referred to as a second growing layer) are accumulated. Lastly, after the electrode layers 10 and 30 on top and bottom are formed, the substrate is cut off into each chip. The detail of the manufacturing process is described in Japanese laid-open Patent Application S61-163688.

Figure 3:
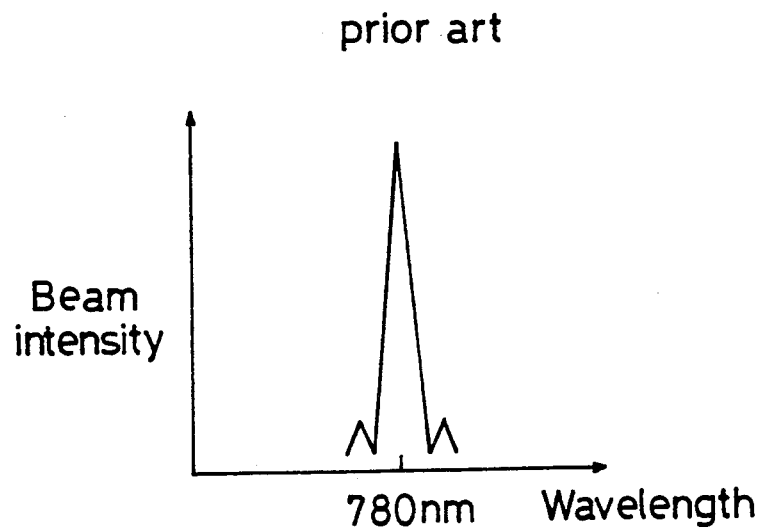
FIG. 3 is a graph showing an oscillation spectrum of the conventional semiconductor laser device.
Figure 6:
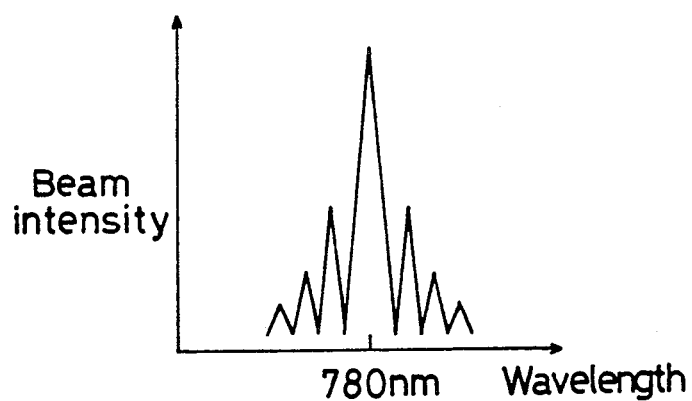
FIG. 6 is a graph showing an oscillation spectrum of the semiconductor laser device which is an embodiment of the present invention.

By giving the partly narrow configuration to the striped groove 32 as described above, the present invention is provided with the following features. First, by giving the partly narrow configuration to an opening of the current blocking layer 16, that is, to a contacting portion (through the protecting layer 20) of the second upper clad layer 14 and the first upper clad layer 22, an active region formed in the active layer 24 becomes the partly narrow configuration. An active region of a semiconductor laser device serves as an oscillator of laser beam. Within the active region, an electric field corresponding to a laser beam generates a standing wave. Because of this, in a semiconductor laser device according to this embodiment, a configuration of the standing wave is not uniform, and oscillation of plural modes where different standing waves are generated occurs to simultaneously generate laser beams, of plural modes, having different standing wave structures. An oscillation spectrum of the semiconductor laser device according to this embodiment is shown in FIG. 6, and that of a conventional semiconductor laser device is shown in FIG. 3. As described above, the semiconductor laser device according to this embodiment, where oscillation of a laser beam having a low coherence is enabled by the multi mode oscillation, is a laser beam generator which is hardly affected by the optical feedback from an external optical system and where noise is hardly induced.

Second, in the semiconductor laser device according to this embodiment, since the width of only inside of the striped groove 32 is narrowed and a width w of both ends (emitting ends) is the same as that of conventional striped grooves, laser oscillation characteristics such as a spreading angle, etc. are the same as those of conventional semiconductor laser devices. Hence, the semiconductor laser device according to this embodiment can be employed for a conventional semiconductor laser device without any changes of settings.

Although two narrow portions are provided in the above-described embodiment, the number may be three or more.

As described above, according to the present invention, coherence of an oscillated laser beam is reduced by giving the striped portion a complicated configuration and noise induced by the optical feedback is reduced when used for a pickup of an optical information recording/reproducing apparatus, so that information can be read with a high reliability. Moreover, since both ends of the striped portion in a direction along the length is the same as that of conventional striped portions so that the spreading angle, etc. of outputted laser beam is the same as that of conventional lasers, it is not required to change a design of a pickup optical system of an optical information recording/reproducing apparatus.

Obviously, many modifications and variations of the present invention are possible in light of the above teachings. It is therefore to be understood that within the scope of the appended claims, the invention may be practiced other than as specifically described.

What is claimed is:

1. A semiconductor laser device comprising:
an active layer having a cavity;
a lower clad layer provided below said active layer;
an upper clad layer provided above said active layer;
a current blocking layer, provided above said upper clad layer, for limiting an active region of said active layer in a direction along a width of said active region to make said active region of a stripe form, said stripe-form active region having a narrow portion which is narrower than a predetermined width of said stripe-form active region, wherein said active layer, said lower clad layer, said upper clad layer and said current blocking layer form an accumulated layer; and
a pair of electrodes provided at an upper and a lower end of said accumulated layer;
wherein oscillation occurs in a plurality of modes of different standing wave configurations in order to simultaneously generate laser beams of the plurality of modes.

2. A semiconductor laser device according to claim 1, wherein said active layer consists of AlGaAs, said lower clad layer consists of N-type AlGaAs, and said upper clad layer consists of P-type AlGaAs.

3. A semiconductor laser device according to claim 1, wherein a protecting layer having a band gap equal to or larger than that of said active layer is provided between said upper clad layer and said current blocking layer.

4. A semiconductor laser device according to claim 1, wherein said narrow portion includes a portion having a constant width and a portion having a width which continuously varies.

5. A semiconductor laser device according to claim 1, wherein multi-mode oscillation occurs so that beam intensity discontinuously and gradually decreases when wavelength increases or decreases from a predetermined wavelength.

6. A semiconductor laser device having an active region of a stripe form, comprising:
an active layer having a cavity;
a lower clad layer provided below said active layer;
an upper clad layer provided above said active layer;
a pair of electrodes provided at an upper and a lower end of an accumulated layer comprising said active layer, said lower clad layer and said upper clad layer, wherein a plurality of narrow portions are provided at portions other than both ends, in a direction along the length of said stripe-form active region.

7. A semiconductor laser device according to claim 6, wherein said active layer consists of AlGaAs, said lower clad layer consists of N-type AlGaAs, and said upper clad layer consists of P-type AlGaAs.

8. A semiconductor laser device according to claim 6, wherein a protecting layer having a band gap equal to or larger than that of said active layer is provided between said upper clad layer and said current blocking layer.

9. A semiconductor laser device according to claim 6, wherein said narrow portion includes a portion having a constant width and a portion having a width which continuously varies.

10. A semiconductor laser device according to claim 6, wherein multi-mode oscillation occurs so that beam intensity discontinuously and gradually decreases when wavelength increases or decreases from a predetermined wavelength.

* * * * *